United States Patent [19]
Carlo et al.

[11] 3,990,059
[45] Nov. 2, 1976

[54] MAGNETIC BUBBLE DETECTOR

[75] Inventors: James Thomas Carlo, Richardson, Tex.; Hon Wai Lam, Cambridge, Mass.

[73] Assignee: Texas Instruments Incorporated, Dallas, Tex.

[22] Filed: Apr. 3, 1975

[21] Appl. No.: 565,027

[52] U.S. Cl. .................... 340/174 TF; 340/174 YC
[51] Int. Cl.² ........................................ G11C 11/14
[58] Field of Search .............................. 340/174 TF

[56] References Cited
UNITED STATES PATENTS

| | | | |
|---|---|---|---|
| 3,713,120 | 1/1973 | Bobeck et al. ................. | 340/174 TF |
| 3,859,643 | 1/1975 | Borrelli ......................... | 340/174 TF |

*Primary Examiner*—James W. Moffitt
*Attorney, Agent, or Firm*—Harold Levine; James T. Comfort; William E. Hiller

[57] ABSTRACT

A magnetic bubble detector comprising a planar layer of magnetic material in which magnetic bubble domains can be moved and a thin planar film on one surface of that layer. The layer has a magnetization perpendicular to the plane of the layer while the film has a magnetization in the plane thereof. The planar layer and film comprise an optical waveguide for propagation of linearly polarized light therethrough along a first axis. Linearly polarized light is coupled into the guide. A bubble expander stretches bubble domains in a direction transverse to their direction of movement as they are moved in the layer of magnetic material past the light guide on a second axis transverse the first axis. A sensor including a light coupling device for coupling light out of said waveguide senses changes in the polarization mode of the light propagating along the axis of the waveguide whereby the fringing field of the stretched bubble will modulate the polarized light propagating along the first axis and provide a light output signal from the sensor thereby indicating the passage of a magnetic domain.

10 Claims, 6 Drawing Figures

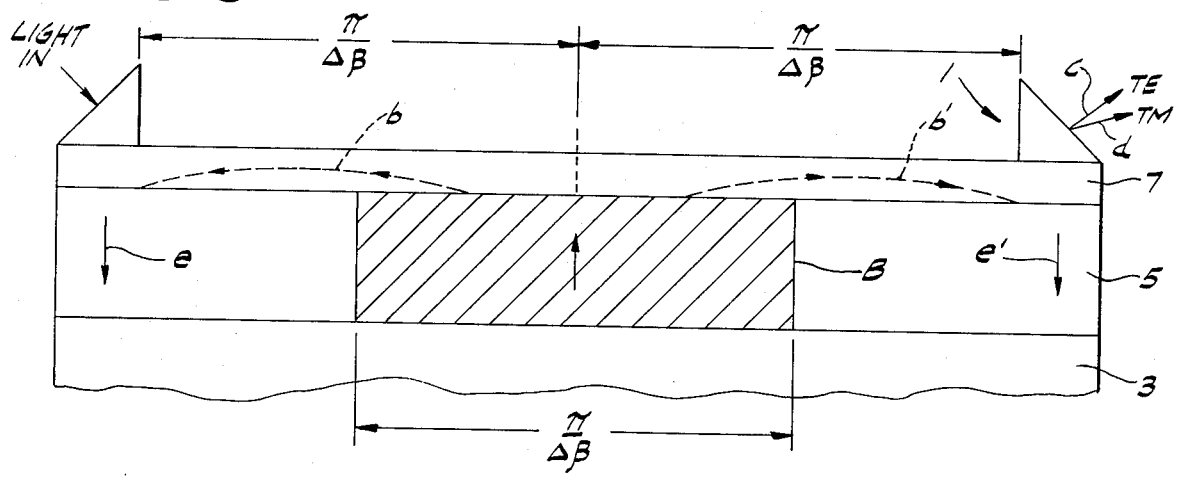
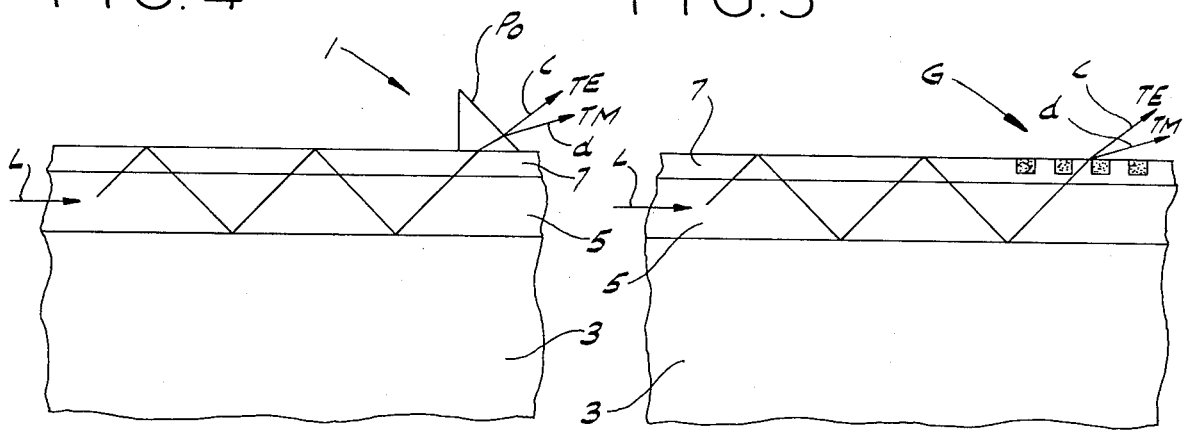
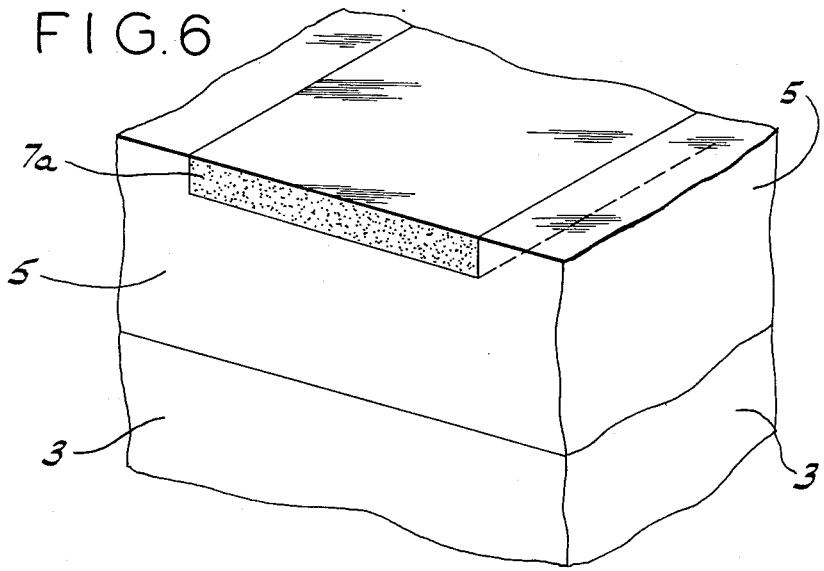

3,990,059

MAGNETIC BUBBLE DETECTOR

BACKGROUND OF THE INVENTION

This invention relates to magnetic bubble detection and more particularly to detectors employing an integrated optics waveguide.

While substantial advances have been made in many areas of cylindrical domain or magnetic bubble technology, one of the significant problems remaining is that of accessing bubble memories by providing a readout. Various types of detectors have been developed for reading or detecting magnetic bubbles as they are moved along a predetermined path and past a read position of a magnetic domain memory. These detectors provide a discrete output signal indicative of the passage of a bubble by the read position. The majority of such detection systems have utilized various magneto-resistive elements, usually formed of a pattern of magnetically soft overlay material, to electrically sense the flux field of the bubble and thereby provide an electrical signal. Such detectors may be satisfactorily fabricated and provide a generally acceptable signal-to-noise ratio, but it would be desirable to be able to provide a detector with an enhanced signal-to-noise ratio. Moreover, these detectors require electronic detector elements and their leads to be placed on the memory chip, all of which diminishes the space available for memory storage on the chip.

The presence of magnetic bubbles in typical magnetic-bubble garnet layers has also been sensed or detected optically but, because of the precise alignment requirements of the optics relative to the detection area and the difficulty in economically fabricating such optical arrangements, progress has been slow in this area and optical methods have hitherto appeared unsuitable in a practical sense.

SUMMARY OF THE INVENTION

Among the several objects of this invention may be noted the provision of magnetic bubble detectors utilizing integrated optics which permit separation of optical and electronic functions of the detection system; the provision of such detectors which permit close spacing of detection regions on bubble memory chips and avoid the placement of electronic elements of the detector system on these chips; the provision of magnetic bubble detectors and methods of bubble detection which reliably sense the presence of a bubble and supply an output signal of improved magnitude at enhanced signal-to-noise ratios; and the provision of such detectors which may be fabricated using existing technology.

Briefly, a magnetic bubble detector of this invention comprises a planar layer of magnetic material in which magnetic bubble domains can be moved and having a magnetization perpendicular to the plane of the layer. A thin planar film is provided on one surface of the layer and it has a magnetization in the plane of the film. The planar layer and film together constitute a composite optical waveguide for propagation of linearly polarized light therethrough along a first axis. The detector further includes means for coupling linearly polarized light into this guide. Means are provided for stretching bubble domains in a direction transverse to their direction of movement as they are moved in the layer of magnetic material past the light guide on a second axis transverse the first axis. Also provided are means for sensing changes in the polarization mode of the light propagating along the axis of the waveguide. These sensing means include means for coupling light out of said waveguide whereby the fringing field of the stretched bubble will modulate the polarized light propagating along the first axis and provide a light output signal from the sensing means thereby indicating the passage of a magnetic domain.

Other objects and features of the invention will be in part apparent and in part pointed out hereinafter.

BRIEF DESCRIPTION OF THE DRAWINGS

FIG. 3 is a longitudinal cross sectional representation of a magnetic bubble detector of this invention;

FIG. 4 diagrammatically illustrates a section through a bubble chip utilizing a prism to couple light out of the waveguide component of a detector of this invention;

FIG. 5 diagrammatically illustrates a section through a bubble chip utilizing an optical grating to couple light out of the waveguide component of a detector of this invention; and FIG. 6 is a diagrammatic representation of a transverse cross section through a waveguide of a detector of this invention illustrating another embodiment thereof.

Corresponding reference characters indicate corresponding parts throughout the several views of the drawings.

DESCRIPTION OF PREFERRED EMBODIMENTS

Figure 1:
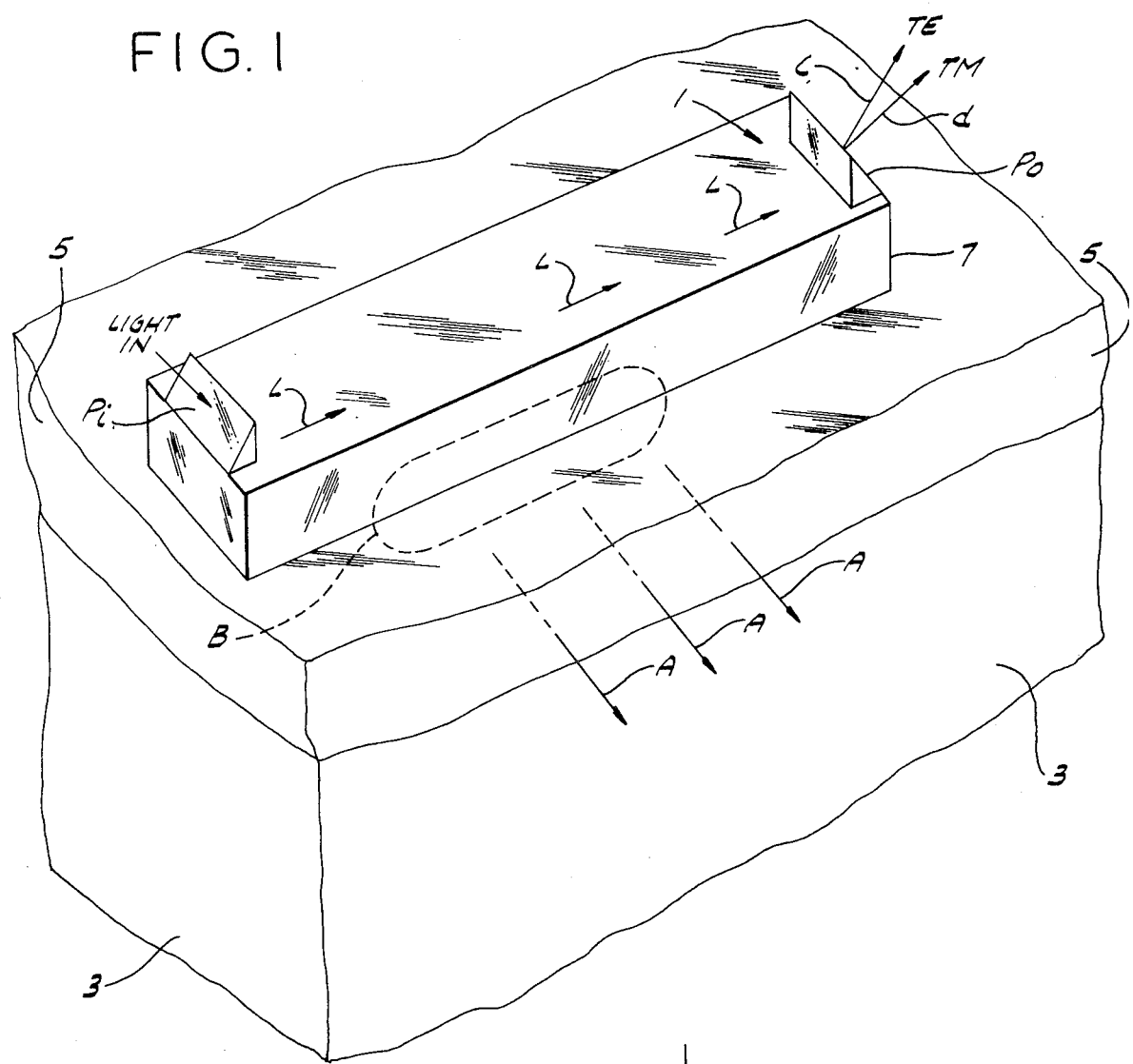
FIG. 1 is a trimetric view on a greatly enlarged scale of a magnetic bubble detector of the present invention.

Referring now to the drawings, and more particularly to FIG. 1, a magnetic bubble detector of this invention is indicated generally at 1. It is formed on the surface of a chip of a typical cylindrical magnetic domain material, such as an oriented slice cut from a singel crystal of rare earth garnet, e.g., gadolinium-gallium garnet, $Gd_3Ga_5O_{12}$, constituting a nonmagnetic substrate portion 3 with a magnetic garnet planar layer 5 possessing uniaxial anisotropy and usually formed by epitaxial deposition on substrate 3. This layer has an easy direction of magnetization perpendicular to the plane of the layer. A typical magnetic garnet material for the propagation of bubbles is samarium garnet, $Y_{2.6}Sm_{0.4}Fe_{3.9}Ga_{1.1}O_{12}$. This layer constitutes a bubble propagation layer or film and has a thickness, for example, of about 4 to 5 microns for the propagation of magnetic bubbles having a nominal size of about 5 microns. The index of refraction of layer 5 is greater than that of substrate 3.

A planar film 7 constitutes the upper region of the chip and may be either an epitaxial layer deposited on the surface of layer 5 or, as will be described hereinafter, a planar film formed by nitrogen annealing or by ion implantation in the exposed surface of layer 5, and subsequent oxygen annealing thereof. In any instance, film 7 has an easy direction of magnetization in the plane of the film and has an index of refraction that is preferably substantially the same as that of layer 5. A typical epitaxially deposited film 7 has a composition of $Y_{2.4}Gd_{0.6}Fe_5O_{12}$, and is about 1 micron thick. The film 7 and layer 5 together constitute a composite waveguide.

Coherent light, such as that generated by a helium-neon laser with a wavelength of 1.15 microns, is optically coupled into the film portion of the composite guide 5,7 by means of a prism Pi as indicated in FIG. 1, with the angle of incidence of the polarized light, either TM (transverse magnetic) mode or TE (transverse electric) mode, selected in accordance with the optical parameters. As film 7 and layer 5 both are magneto-optical material and have refractive indices greater than that of substrate 3 and the surrounding medium (e.g., air), they will serve as a composite waveguide with plane or linearly polarized light L propagating along a lengthwise axis thereof as illustrated. Film 7 also functions to suppress hard bubbles.

Figure 2:
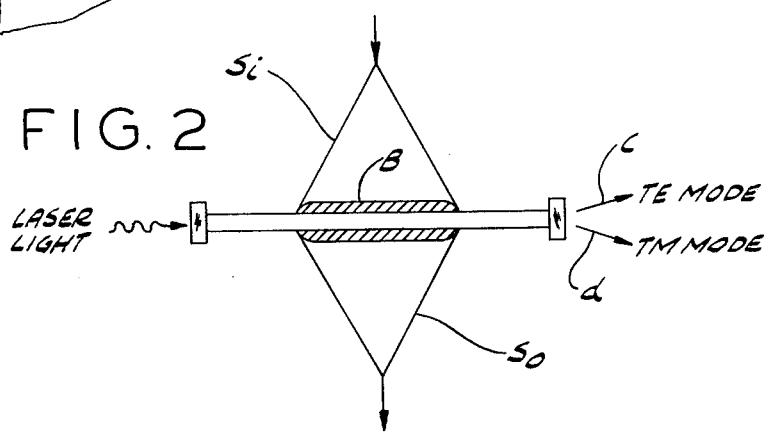
FIG. 2 is a diagrammatic plan view of the magnetic bubble detector of FIG. 1.

Input and output couplers or prisms Pi and Po are so positioned on the bubble chip surface that the axis of the light propagating in the composite guide 5, 7 is transverse to the direction of bubble movement along a bubble path or circuit (not shown) such as is customarily used for memory loops or other registers of a magnetic bubble memory organization. Preferably the bubbles, as they are moved in layer 5 by the customary rotating in-plane magnetic drive field, are stretched by any of the conventional bubble elongation schemes in a direction transverse their direction of movement (as indicated by arrows a), i.e., parallel to the axis of light propagation in the composite waveguide. A typical stretcher is formed by a series of parallel rows of chevron-shaped circuit elements of soft magnetic material with the lengths of each successive row increasing in the direction of bubble movement toward the axis of light propagation and decreasing in length as the bubble moves away therefrom. This is diagrammatically represented in FIG. 2 by the generally diamond-shaped-in-plan pattern outline with Si indicating the input portion of the domain expander or stretcher and So indicating the output portion. A stretched or expanded magnetic bubble or strip domain is indicated at B as it moves through the light path in the waveguide.

Referring now to FIG. 3, bubble B is shown in layer 5 as it moves in layer 5 transversely across the axis of light propagatng in the composite waveguide 5, 7. The fringing field of bubble B as indicated by dashed lines $b$ and $b'$ in film 7 follow the easy direction of magnetization and establish an in-plane field along and parallel to the axis of light propagation. However, the sign of this field is to the left ($b$) on the left side of the bubble as viewed in FIG. 3 and will be oppositely directed as indicated at $b'$ on the right half. On the other hand, in layer 5, again following the easy direction of magnetization in that layer, the fringing field of bubble B will be perpendicular as indicated by the two solid line arrows $e$ and $e'$ pointing downwardly on opposite sides of the bubble with its own polar magnetization symbolized by the upwardly directed solid line internal arrow.

In accordance with this invention the distance between input coupler Pi and output coupler Po is chosen to be equal to $2\pi/\Delta\beta$ where $\Delta\beta$ is the difference between the respective propagation constants, $\beta$, in the composite waveguide for TM (transverse magnetic) and TE (transverse electric) polarization modes or waves. Also, the transverse axis on which the stretched bubble B is moved is positioned to intersect the light propagation axis midway between the light input and output couplers and the bubble width (along the light propagation axis) is stretched so as to be equal to $\pi/\Delta\beta$. Thus, as the light propagates from Pi to the middle of the bubble there will be conversion of TE mode polarized light, for example, to TM light. As the sign of the magnetization is changed as the light propagates from the middle of the bubble toward output coupler Po a further conversion or modulation of TE to TM light will be effected by this portion of the fringing field of the bubble thus giving a net and effectively continuous conversion over one full period of $2\pi/\Delta\beta$. It will be noted that if the magnetization direction did not change as indicated at $b$ and $b'$ there would have been little or no net effective change or conversion as there would be TE to TM conversion in the left half of the guide and TM to TE conversion in the right half. Energy conversion will be concentrated in film 7 because of the parallel alignment of the fringing field magnetization therein with the axis of light propagation, even though most of the energy will be carried in the bubble layer 5, because of its greater thickness. Thus there is excellent coupling of the fringing field of bubble B in the film 7 with the light energy propagating therein because of the reversed directions of the field in that film and good phase matching. Accordingly, the fringing field of the bubble B will perturb and interact with the light modes in the composite waveguide to effect an increased mode switching or modulation of the polarized light. A TE wave or mode, for example, may thus be changed or converted into a TM wave, or vice versa. With no bubble present the magnetization will not point in the favorable direction and little or no net mode conversion over a period of $2\pi/\Delta\beta$ takes place. As the direction of magnetization in film 7 is affected by the usual in-plane drive field for bubble propagation, its effects will have to be suppressed or compensated by appropriate design of bubble and drive fields and arrangement geometry.

The polarized light L thus modulated is coupled out of the film 7 by a prism Po. As is also true of input coupling prism Pi, Po is preferably made of an anisotropic crystalline or birefringent material, such as rutile. For bubbles having a nominal size of say 5 microns the length of the guide from Pi to Po as determined by $2\pi/\Delta\beta$ will be about 0.2 cm. and the domain is preferably stretched to about $\pi/\Delta\beta$, or about 0.1 cm. in length, these dimensions being compatible with device application. As discussed above for any particular light polarization mode in the film, there will be a distinct film propagation constant. Also there will be different indices of refraction for such prisms for different light polarization modes. As a result, when the modulated light is coupled out of the film 7 portion of the composite guide by prism Po, the direction of the emerging light of one polarization mode will be deflected relative to the angle of emergence of light of the other polarization mode. Thus light of different polarization modes is differentially coupled out of the guide to provide two light beams, the relative intensities of which are functions of the changes in the polarization mode of the light propagating in the guide effected by the fringing field of a bubble moving therepast. For example, as indicated by arrows $c$ and $d$ in FIGS. 1–3, TE light waves emerge at an angle greater by, say, 20° than that at which TM light emerges. As the passage of a bubble by the light propagation path effects mode conversion of the propagating light in the guide and the resultant deflection of the light coupled out of it, a light output signal is produced which indicates the passage of each bubble. The output coupler functions, therefore, to effect a sensing of bubble-induced changes in the polarization mode of the light propagating in the guide and thus serves as a detector.

The use of a prism Po to couple the light modes out of the waveguide as discussed above is illustrated in more detail in FIG. 4. FIG. 5 illustrates another means for coupling light out of the waveguide. There an optical grating G is formed by ion implanting techniques as described above to form a series of parallel spaced rows of ion-implanted strips, the spacing being a function of the wavelength of light being propagated and the waveguide propagation constant. An exemplary optical grating G was formed by exposing photoresist to a 4880A interferometer fringe pattern, removing the unexposed resist and then ion-implanting the exposed areas to form the implanted stripes with a 0.77 micron spacing (center-to-center) period where the wavelength of the laser light was 1.15 microns and the normalized waveguide propagation constant was 2.2. Alternatively an optical grating may be formed by metallic deposition of the stripes again using conventional masking and deposition techniques so widely used in integrated circuit technology.

The light output signal may be selectively transmitted to a light responsive sensor unit, such as a germanium avalanche detector, which will produce an electrical signal in response to the light signal received. As this light sensor may be positioned at a location remote from the chip no electrical leads or connections need be provided for this purpose on the chip. Similarly the light output signal beam may be directed to another chip for direct control utilization there.

The detector of this invention has a modulation effect which is perhaps 60 times greater than has been obtained with other systems. It appears that a $6 \times 10^{-2}\%$ of modulation could be achieved theoretically with a film having a 200°/cm. Faraday rotation. For a film with a 2,000°/cm. Faraday rotation the modulation could well be in the order of 6%, a very suitable level for detection of single bubbles.

As noted previously and illustrated in FIG. 1, the film 7 may be formed as a separate layer. This may be accomplished by utilizing electron beam processing to form the desired light guide pattern, metal masking and ion milling to insure good edge definition on the guide, all techniques well-known to those in the integrated circuit art.

Alternatively film 7 may be formed in an exposed surface of the bubble layer 5 by ion implantation techniques, also familiar to those in the integrated circuit art. Such an ion implanted layer 7a is illustrated in FIG. 6. Typically, hydrogen, neon or argon ions of an energy level of 100–200 kEv are directed at the surface of the bubble layer 5 which is appropriately masked except over the region which is to be implanted and serve as the light guide. The bombarding ions cause a local expansion in the surface region of layer 5 to effect a lateral compression which alters the crystal lattice structure changing both the magnetic properties (so that the total anisotropy is overcome and the direction of easy magnetization will be in the plane of the layer). Preferably the thus ion-implanted film 7a, formed in the surface region of a samarium garnet layer 5, is oxygen-annealed (e.g., at 700°C. for about 2 hours) to relieve lattice strain and minimize light scattering to reduce light propagation losses. Alternatively this film may be formed by nitrogen-annealing the chip (e.g., 2 to 20 or more hours at about 1075°C. in an atmosphere of nitrogen) which affects a diffusion reducing the concentration of gallium in the region of layer 5 adjacent to the non-magnetic substrate 3. As so formed, this film is an internal film located between the layer 5 and the substrate 3 with the desired easy axis of magnetization in the plane of the film.

These films, such as indicated at 7 and 7a, are typically about 0.5 to 1 micron deep for use in detection of magnetic bubbles having a nominal 5-micron diameter. It will be understood, however, that the magnetic domain detectors of this invention are particularly well adapted for use with submicron-size bubbles because among other advantageous factors the thickness of the film 7 can constitute a large fraction of the thickness of layer 5, and that the foregoing dimensions will be appropriately reduced using smaller bubbles. Moreover, the use of a composite waveguide of this invention avoids the possible difficulty in establishing a light guide of good characteristics in a single film overlying a magnetic bubble layer.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A magnetic bubble detector comprising:
   a planar layer of magnetic material in which magnetic bubble domains can be moved and having a magnetization perpendicular to the plane of the layer;
   a thin planar film on one surface of said planar layer of magnetic material and having a magnetization in the plane of the film;
   said planar layer of magnetic material and said planar film comprising a composite optical waveguide for the propagation of linearly polarized light therethrough along an axis of the waveguide;
   means for coupling linearly polarized light into said waveguide;
   means for stretching magnetic bubble domains in a direction transverse to their direction of movement as they are moved in the layer of magnetic material past the waveguide along a path intersecting with said waveguide and transverse to the axis thereof; and
   means for sensing changes in the polarization mode of the light propagating along the axis of the waveguide, the sensing means including means for coupling light out of said waveguide whereby the movement of a magnetic bubble domain along the path so as to intersect with said waveguide will modulate the polarized light propagating along the axis of the waveguide by the fringing field of the stretched magnetic bubble domain so as to provide a light output signal from the sensing means thereby indicating the passage of a magnetic bubble domain.

2. A detector as set forth in claim 1 wherein the layer and the film have substantially the same indices of refraction.

3. A detector as set forth in claim 1 in which the spacing between the means for coupling light into said waveguide and the means for coupling light out of the waveguide is $2\pi/\Delta\beta$ where $\Delta\beta$ is the difference between the propagation constants of the TM and TE light modes propagating in said waveguide.

4. A detector as set forth in claim 3 wherein the path on which the stretched magnetic bubble domain moves is positioned to intersect the light propagation axis midway between the input and output light coupling means, and in which each magnetic bubble domain moving on this path is stretched to a dimension equal to one-half the distance between the input and output light coupling means as it passes the light propagation axis.

5. A detector as set forth in claim 4 in which at least the output light coupling means is a grating coupler.

6. A detector as set forth in claim 4 in which the light coupling means are prism couplers.

7. A detector as set forth in claim 4 in which the film is a nitrogen-annealed region of said planar layer.

8. A detector as set forth in claim 4 in which the film is an ion-implanted surface region of said planar layer.

9. A detector as set forth in claim 8 in which the ion-implanted surface region is oxygen-annealed.

10. A magnetic bubble detector comprising:
a planar layer of magnetic material in which magnetic bubble domains can be moved and having a magnetization perpendicular to the plane of the layer;
a thin planar film on one surface of said planar layer of magnetic material and having a magnetization in the plane of the film;
said planar layer of magnetic material and said planar film comprising a composite optical waveguide for the propagation of linearly polarized light therethrough along an axis of the waveguide;
means for coupling linearly polarized light into said waveguide;; and
means for sensing changes in the polarization mode of the light propagating along the axis of the waveguide, the sensing means including means for coupling light out of said waveguide whereby the movement of a magnetic bubble domain in the layer of magnetic material past the waveguide along a path intersecting with said waveguide and transverse to the axis thereof will modulate the polarized light propagating along the axis of the waveguide by the fringing field of the magnetic bubble domain so as to provide a light output signal from the sensing means thereby indicating the passage of a magnetic bubble domain.

* * * * *